United States Patent [19]
Yoon et al.

[11] Patent Number: 5,523,978
[45] Date of Patent: Jun. 4, 1996

[54] SUPPLY VOLTAGE DETECTING CIRCUIT OF A SEMICONDUCTOR MEMORY DEVICE

[75] Inventors: Sei-Seung Yoon, Seoul; Jei-Hwan You, Kyungki-do, both of Rep. of Korea

[73] Assignee: Samsung Electronics Co., Ltd., Suwon, Rep. of Korea

[21] Appl. No.: 269,607

[22] Filed: Jul. 5, 1994

[30] Foreign Application Priority Data

Jul. 2, 1993 [KR] Rep. of Korea .................. 12428/1993

[51] Int. Cl.⁶ ................................................ G11C 13/00
[52] U.S. Cl. ........................................... 365/229; 365/226
[58] Field of Search ...................... 365/226, 229

[56] References Cited

U.S. PATENT DOCUMENTS 4,777,626  10/1988  Matsushita et al. .................... 365/229

Primary Examiner—Terrell W. Fears

[57] ABSTRACT

The present invention relates to a semiconductor memory device and more particularly to a power supply voltage detecting circuit of a semiconductor memory device which senses a voltage level of the power supply voltage. A power supply voltage detecting circuit of the present invention includes a circuit for generating a power supply voltage detecting signal by receiving a power supply voltage and a control circuit for generating a control signal in order to operate the circuit for generating the power supply voltage detecting signal when being in a specific mode state. The power supply voltage detecting circuit according to the present invention can reduce power consumption by cutting off a standby-current, since the power supply voltage detecting circuit is enabled during an activation of a chip. This allows the output signal of the power supply voltage detecting circuit to have an accurate voltage level of a power supply voltage or a ground voltage, so that chip operation speed can be improved and the effectiveness of the chip can be improved by removing noises.

6 Claims, 6 Drawing Sheets

5,523,978

SUPPLY VOLTAGE DETECTING CIRCUIT OF A SEMICONDUCTOR MEMORY DEVICE

FIELD OF THE INVENTION

The present invention relates to a semiconductor memory device and more particularly to a power supply voltage detecting circuit for detecting a voltage level of the power supply voltage.

BACKGROUND OF THE INVENTION

Generally, a power supply voltage detecting circuit of a semiconductor memory device is for detecting the changes of the power supply voltage applied to the interior of a chip, based on a specific voltage. When the voltage level of the power supply voltage applied to the interior of a chip is greatly changed, such a power supply voltage detecting circuit should be provided into semiconductor memory elements. This is well disclosed in U.S. Pat. Nos. 4,224,539 and 4,013,902.

FIG. 1 is a diagram showing a conventional power supply voltage circuit. The circuit includes diode-connected NMOS transistors 100 and 105 between a power supply voltage Vcc and a node N1, a resistor 115 between the node N1 and a ground voltage, and an invertor 110 between the node N1 and an output node N2.

As depicted in FIG. 1, the power supply voltage Vcc applied from an exterior is applied to the invertor 110 through the diode-connected NMOS transistors 100 and 105. When the power supply voltage Vcc passes through the diode-connected NMOS transistors 100 and 105, the voltage drops by the threshold voltage Vth of each of the respective diode-connected NMOS transistors 100 and 105. Accordingly, the voltage at the node N1 is Vcc-2Vth. If a low power supply voltage is applied to the power supply voltage detecting circuit of FIG. 1, since the voltage at the node N1 is lower than a logic threshold voltage of the inverter 110, the voltage level at the output node N2 becomes a logic "high" state. On the other hand, if a high power supply voltage is applied to the power supply voltage detecting circuit, the voltage level at the output node N2 becomes a logic "low" state.

In a conventional circuit however, in the case that the voltage at the node N1 has a intermediate value between the power supply voltages and the ground voltage, since a direct-current path is formed between a power supply voltage terminal and a ground voltage terminal of the inverter 110, there is a problem that the current flows even in a standby-state of a chip. Therefore, a current is continuously consumed. Further, when applying the low power supply voltage to the power supply voltage circuit, a operation speed of a chip is decreased. Moreover, when applying a high power supply voltage to the power supply voltage circuit, a chip effectivity is reduced a malfunction is generated due to the increased noise.

SUMMARY OF THE INVENTION

It is therefore one object of the present invention to provide a power-supply-voltage detecting circuit which operates only while a chip is in an active state.

It is another object of the present invention to provide in power-supply-voltage detecting circuit which is capable of reducing the consumption of a standby-current.

It is still object of the present invention to provide a power supply voltage detecting circuit which allows an output signal of the power supply voltage detecting circuit to have an accurate voltage level of a power supply voltage and ground voltage.

According to an aspect of the present invention, a power supply voltage detecting circuit of the present invention includes a circuit for generating a power-supply-voltage detecting signal by receiving a power supply voltage, and a control circuit for generating a control signal in order to operate the circuit for generating the power supply voltage detecting signal in a specific mode state.

According to another aspect of the present invention, a power-supply-voltage detecting circuit of the present invention includes a reference-voltage generating circuit for generating a reference voltage of a constant voltage level by receiving a power supply voltage, a comparison voltage generating circuit for generating a comparison voltage by receiving the reference voltage, a sense amplifying circuit for comparing and amplifying a voltage difference between the reference voltage and the comparison voltage to output a power-supply-voltage detecting signal, and a control circuit for generating a control signal to operate the comparison-voltage generating circuit and the sense amplifying circuit when a chip is in an active state.

According to still another aspect of the present invention, a power-supply-voltage detecting circuit of the present invention includes a reference-voltage generating circuit for generating a reference voltage of a constant voltage level by receiving a power supply voltage, a comparison voltage generating circuit for generating a comparison voltage by receiving the reference voltage, a sense amplifying circuit for outputting a power supply voltage detecting signal by receiving the reference voltage and the comparison voltage, a latch circuit for latching the power-supply-voltage detecting signal by receiving the power-supply-voltage detecting signal and outputting the latched power-supply-voltage detecting signal, a control circuit for generating a control signal in response to an input signal, and a pulse generating circuit for generating a first pulse signal for operating the comparison voltage generating circuit and the sense amplifying circuit in response to the control signal and generating a second pulse signal for controlling the latch circuit when a chip is in an active state.

BRIEF DESCRIPTION OF DRAWINGS

A more complete appreciation of the inventions, and many of the attendant advantages thereof, will be readily enjoyed as the same becomes better understood by reference to the following detailed description when considered in conjunction with the accompanying drawings in which like numbers indicate the same or similar components, wherein.

DETAILED DESCRIPTION OF THE PREFERRED EMBODIMENTS

Figure 1:
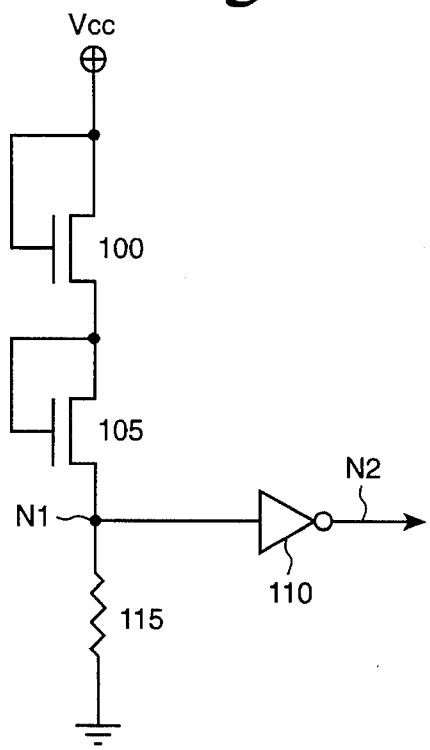
FIG. 1 is a diagram showing a conventional power supply voltage circuit.
Figure 2:
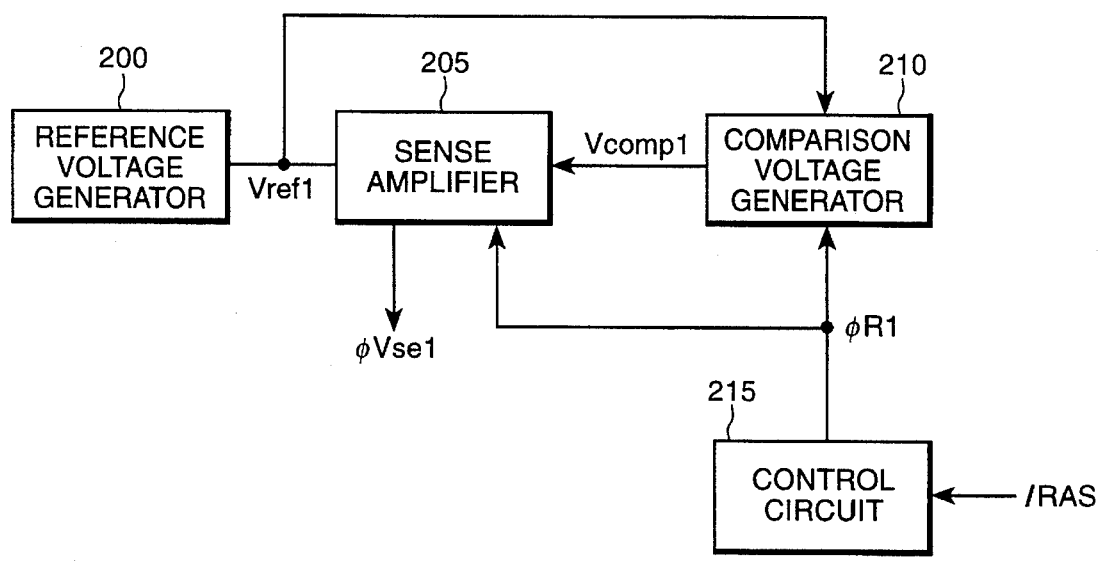
FIG. 2 is a schematic block diagram showing a power supply voltage detecting circuit according to a first preferred embodiment of the present invention.
Figure 3:
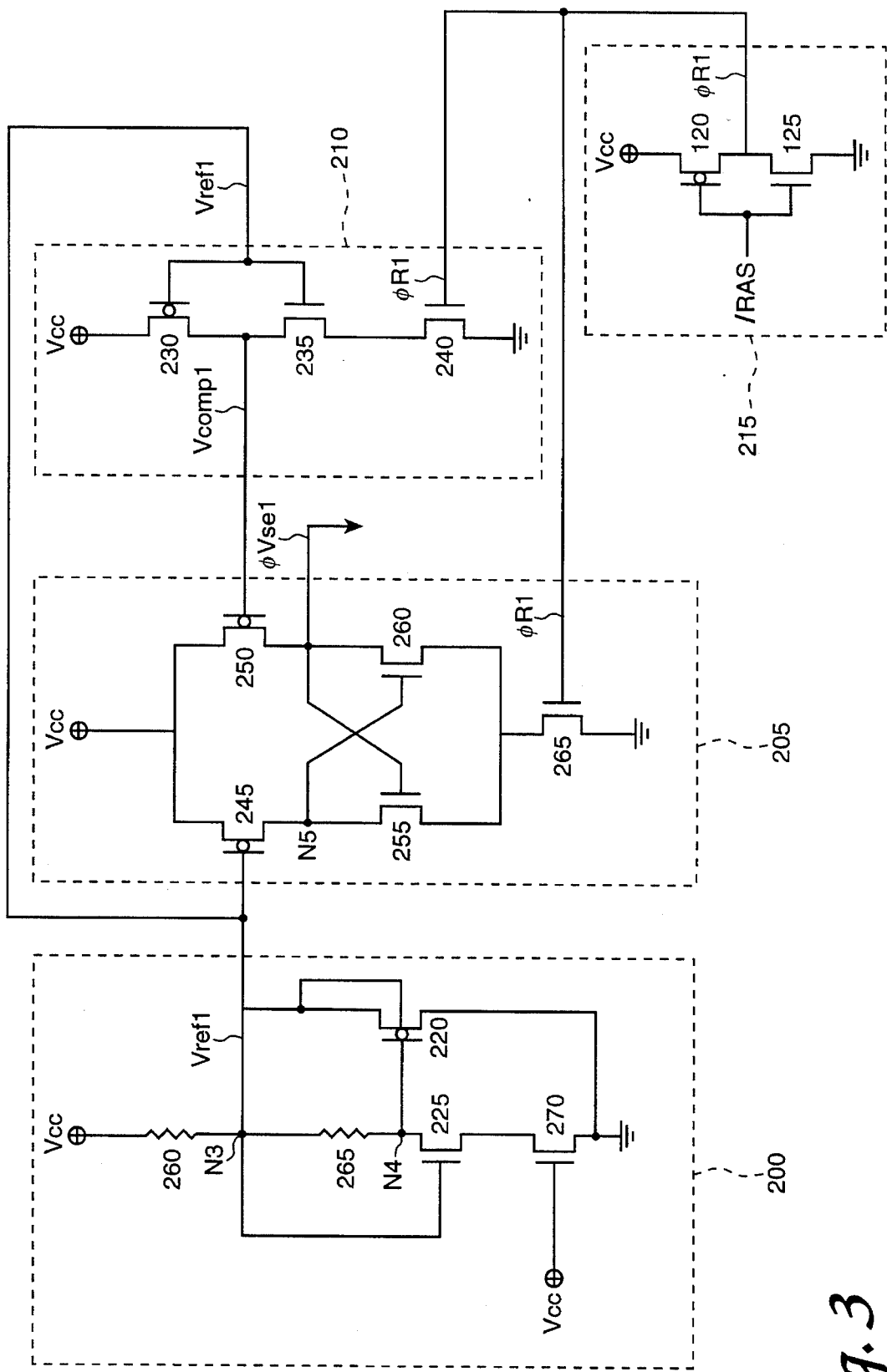
FIG. 3 is a detailed diagram showing a power supply voltage detecting circuit of FIG. 2.

FIG. 2 is a schematic block diagram showing a power supply voltage detecting circuit according to a first preferred embodiment of the present invention and FIG. 3 is a detailed diagram showing the power supply voltage detecting circuit of FIG. 2. The power supply voltage detecting circuit of FIG. 3 includes a reference voltage generator 200 for generating a reference voltage Vref1 by receiving a power supply voltage Vcc, a comparison voltage generator 210 for generating a comparison voltage Vcomp1 by receiving the reference voltage Vref1, a sense amplifier 205 for outputting a power supply voltage detecting signal ΦVse1 by comparing and amplifying a voltage difference between the reference voltage Vref1 and the comparison voltage Vcomp1, and a control circuit 215 for generating a control signal ΦR1 to operate the comparison voltage generator 210 and the sense amplifier 205 when a chip is in an active state.

Figure 4:
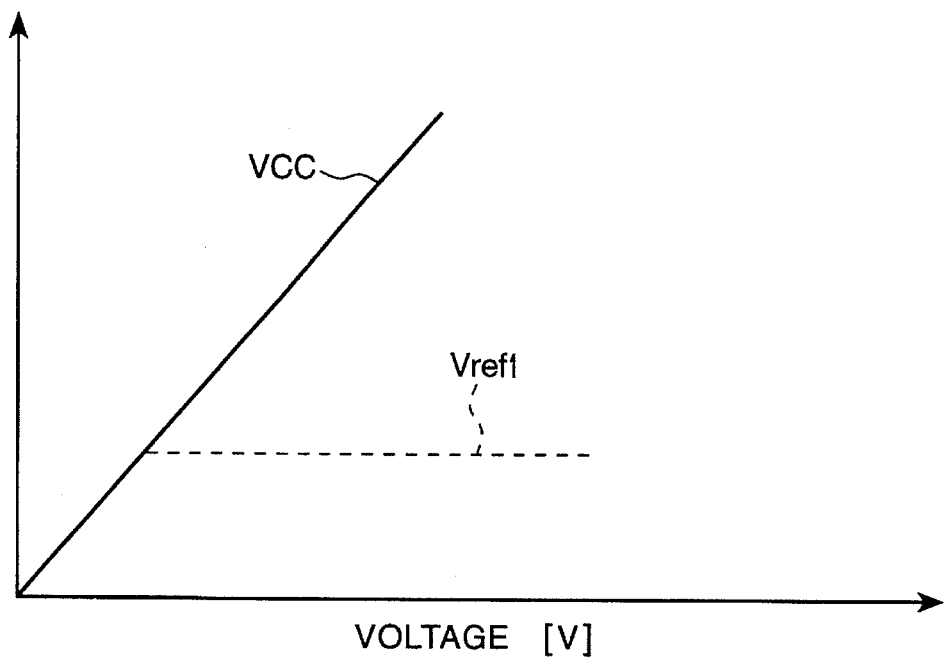
FIG. 4 is a graphical illustration showing a relationship between a power supply voltage and reference voltage of FIG. 3.
Figure 5:
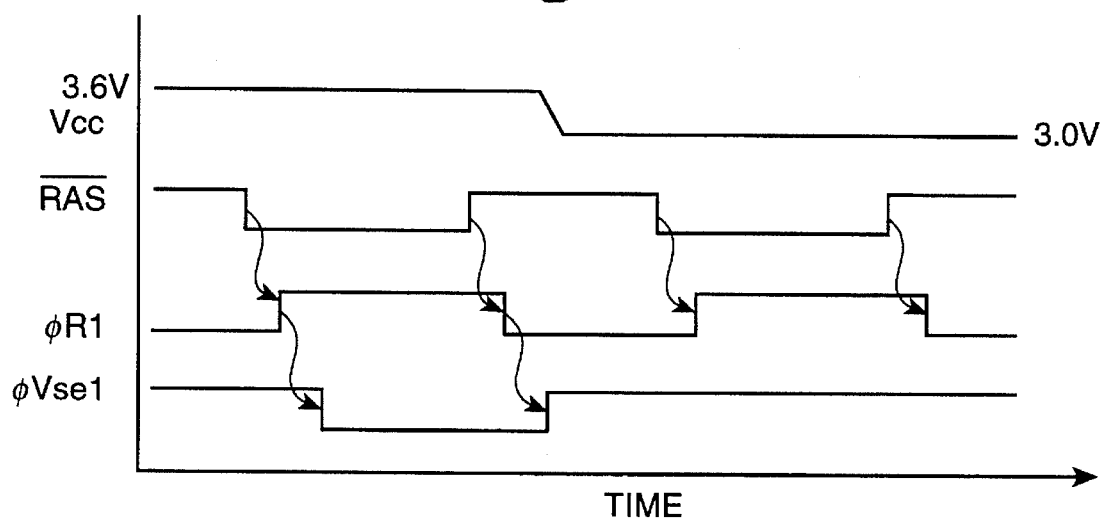
FIG. 5 is a timing diagram of FIG. 2 according to a first preferred embodiment of the present invention.

An explanation of the power supply voltage detecting circuit of FIG. 3 according to the present invention will be hereinafter given with reference to FIG. 5 which is a timing diagram of FIG. 2. In FIG. 3, when the voltage level of the power supply voltage applied to the reference voltage generator 200 is constant, the reference voltage Vref1 is clamped. Here, if the voltage level of the power supply voltage is high, the voltage level at a node N3 goes high, thereby turning on an NMOS transistor 225. As a result, the voltage level at a node N4 goes low, thereby turning on a PMOS transistor 220. Hence, as the voltage level at the node N3 becomes relatively lower, the voltage level of the reference voltage Vref1 becomes low, thereby maintaining a constant voltage. On the other hand, if the voltage level of the power supply voltage applied to the reference voltage generator 200 is low, the voltage level at the node N3 goes low, thereby turning off the PMOS transistor 220 and the NMOS transistor 225. As a result, as the voltage level at the node N3 becomes relatively higher, the voltage level of the voltage of the reference voltage Vref1 becomes high, thereby maintaining a constant voltage therein. As shown in FIG. 4, even though the power supply voltage Vcc increases linearly, the reference voltage Vref1 has a constant value.

FIG. 4 is a graphical illustration showing a relationship between a power supply voltage Vcc and reference voltage Vref1 of FIG. 3.

In FIG. 3, the control circuit 215 includes a PMOS transistor 120 and an NMOS transistor 125 between the power supply voltage Vcc and the ground voltage. If a row address strobe signal $\overline{RAS}$ of a logic "high" state is changed to a logic "low" state, the PMOS transistor 120 is turned on, and the control signal ΦR1 having a logic "high" state is generated and applied to the sense amplifier 205 and the comparison voltage generator 210.

The comparison voltage generator 210 includes a PMOS transistor 230 and an NMOS transistor 235 both of whose gates are connected to the reference voltage Vref1 generated from the reference voltage generator 200, and an NMOS transistor 240 adjacent to the ground voltage terminal whose gate is connected to the control signal ΦR1 generated from the control circuit 215. The reference voltage Vref1 from the reference voltage generator 200 inputs to the gates of the PMOS transistor 230 and NMOS transistor 235 of the comparison voltage generator 210, and the control signal ΦR1 is applied to the gate of the NMOS transistor 240 adjacent to the ground voltage of the comparison voltage generator 210. The voltage of the comparison signal Vcomp1 in accordance with the power supply voltage Vcc applied to the comparison voltage generator 210 is dependent upon the size of the PMOS transistor 230 and the NMOS transistor 235. If the size of the PMOS transistor 230 is larger than that of the NMOS transistor 235, the power supply voltage detecting level of the PMOS transistor 230 for the power supply voltage Vcc becomes low. That is, the PMOS transistor 230 has an improved driving capability for the changes of the power supply voltage Vcc. On the other hand, if the size of the NMOS transistor 235 is larger than that of the PMOS transistor 230, the power supply voltage detecting level of the PMOS transistor 230 becomes high. In such a construction, the comparison voltage generator 210 is activated only while the control signal ΦR1 is enabled and the NMOS transistor 240 can reduce power consumption by cutting off the flow of the standby-current when the comparison voltage generator 210 is in a non-activation state.

The sense amplifier 205 includes PMOS transistors 245 and 250 performing a complementary operation to each other, cross-connected NMOS transistors 255 and 260, and an NMOS transistor 265. The reference voltage Vref1 generated from the reference voltage generator 200 and the comparison voltage Vcomp1 generated from the comparison voltage generator 210 are respectively inputted to the gates of the PMOS transistors 245 and 250. In the meanwhile, the control signal ΦR1 generated from the control circuit 215 is inputted to the gate of an NMOS transistor 265 adjacent to the ground voltage terminal of the sense amplifier 205. If the voltage level of the power supply voltage Vcc applied to the sense amplifier 205 is over a target level, the PMOS transistor 245 is turned on and the voltage level at a node N5 goes high, since the voltage level of the reference voltage Vref is lower than that of the comparison voltage Vcomp1. As the voltage level at the node N5 becomes high, the NMOS transistor 260 is turned on and the power supply voltage detecting signal ΦVse1 generated from the sense amplifier 205 is in a logic "low" state. On the other hand, if the voltage level of the power supply voltage Vcc applied to the sense amplifier 205 is below a target level, the PMOS transistor 250 is turned on and the power supply voltage detecting signal ΦVse1 is in a logic "high" state, since the voltage level of the comparison voltage Vcomp1 is lower than that of the reference voltage Vref1. The NMOS transistor 265 operates in accordance with the control signal ΦR1 from the control circuit 215 of FIG. 2. The sense amplifier 205 is activated only while the control signal ΦR1 is enabled and the NMOS transistor 265 can reduce power consumption by cutting off the flow of the standby-current when the sense amplifier 205 is in a non-activation state.

Figure 6:
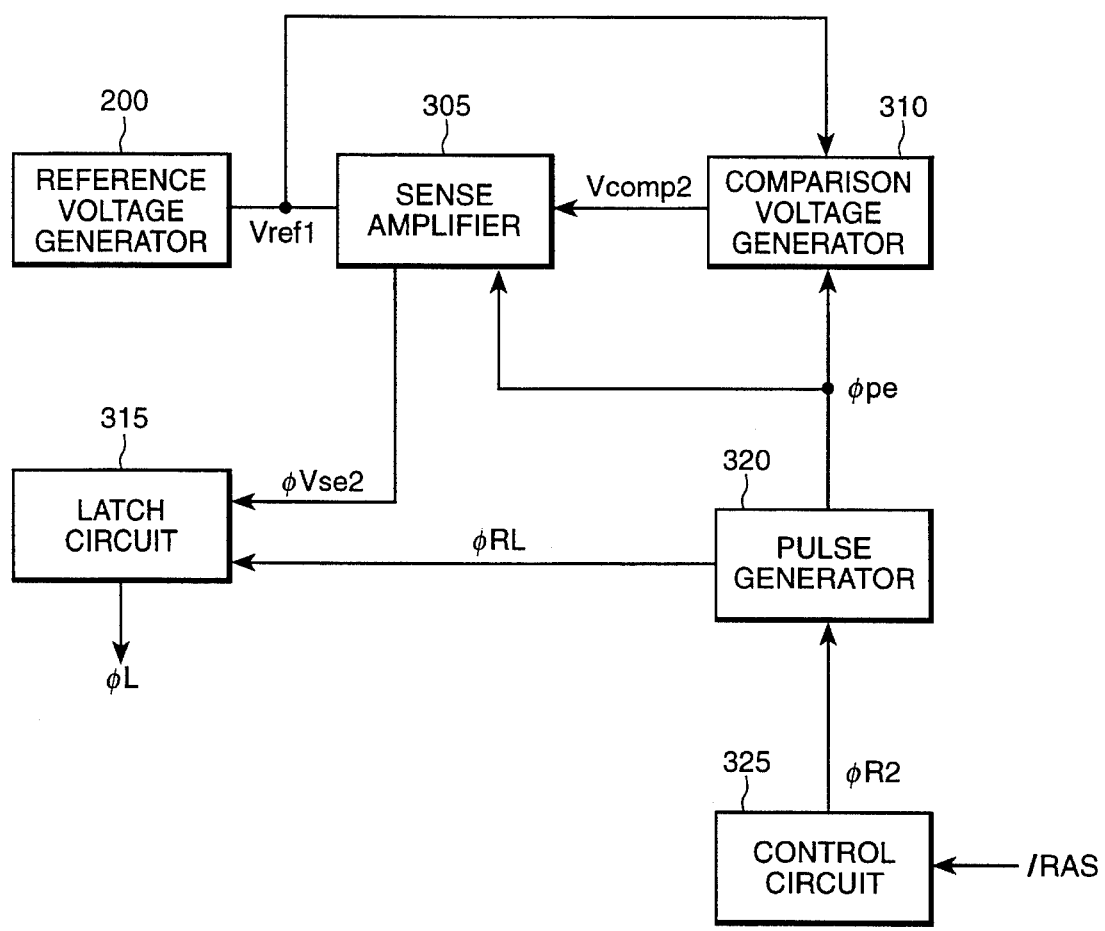
FIG. 6 is a schematic block diagram showing a power supply voltage detecting circuit according to a second preferred embodiment of the present invention.
Figure 7:
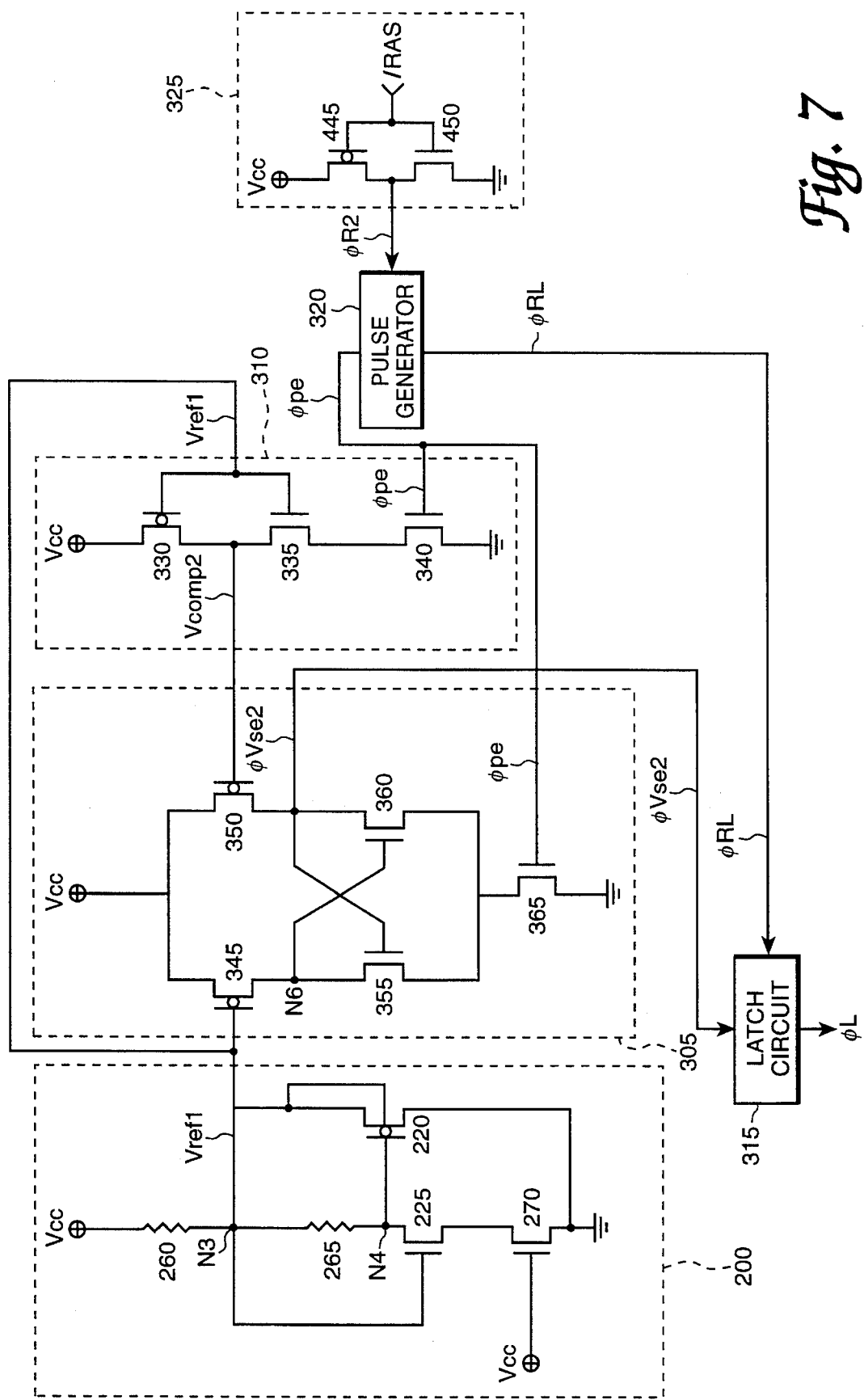
FIG. 7 is a detailed diagram showing a power supply voltage detecting circuit of FIG. 6.

FIG. 6 is a schematic block diagram showing a power supply voltage detecting circuit according to a second embodiment of the present invention and FIG. 7 is a detailed diagram showing a power supply voltage detecting circuit of FIG. 6. The power supply voltage detecting circuit of FIG.

7 includes a reference voltage generator 200 for generating a reference voltage Vref1 of a constant voltage level by receiving a power supply voltage Vcc, a comparison voltage generator 310 for generating a comparison voltage Vcomp2 by receiving the reference voltage Vref1, a sense amplifier 305 for outputting a power supply voltage detecting signal ΦVse2 by receiving a voltage difference between the reference voltage Vref1 and the comparison voltage Vcomp2 to output a power supply voltage detecting signal ΦVse2, a latch circuit 315 for latching the power supply voltage detecting signal ΦVse2 by receiving the power supply voltage detecting signal ΦVse2, a control circuit 325 for generating a control signal ΦR2 in response to a row address strobe signal $\overline{RAS}$ and a pulse generator 320 for generating a first pulse signal Φpe which operates the comparison voltage generator 310 and the sense amplifier 305 in response to the control signal ΦR2 when a chip is in an active state, and a second pulse signal ΦRL which controls the latch circuit 315.

When the power supply voltage applied to the reference voltage generator 200 has a constant voltage level, the reference voltage Vref1 is clamped. As shown in FIG. 7 if the voltage level of the power supply voltage is high, the voltage level at the node N3 goes high, thereby turning on the NMOS transistor 225. As a result, the voltage level at the node N4 goes low, thereby turning on the PMOS transistor 220. Hence, as the voltage level at the node N3 becomes relatively lower, the voltage of the reference voltage Vref1 becomes low, thereby maintaining a constant voltage therein. On the other hand, if the voltage level of the power supply voltage applied to the reference voltage, generator 200 is low, the voltage level at the node N3 goes low, thereby turning off the PMOS transistor 220 and the NMOS transistor 225. As a result, as the voltage level at the node N3 becomes relatively higher, the voltage of the reference voltage Vref1 becomes high, thereby maintaining a constant voltage therein.

The control circuit 325 includes a PMOS transistor 445 and an NMOS transistor 450 between the power supply voltage Vcc and the ground voltage. If the row address strobe signal $\overline{RAS}$ is changed from a logic "high" state to a logic "low" state, the PMOS transistor 445 is turned on, and the control signal ΦR2 having a logic "high" state is generated and applied to the pulse generator 320.

Figure 8:
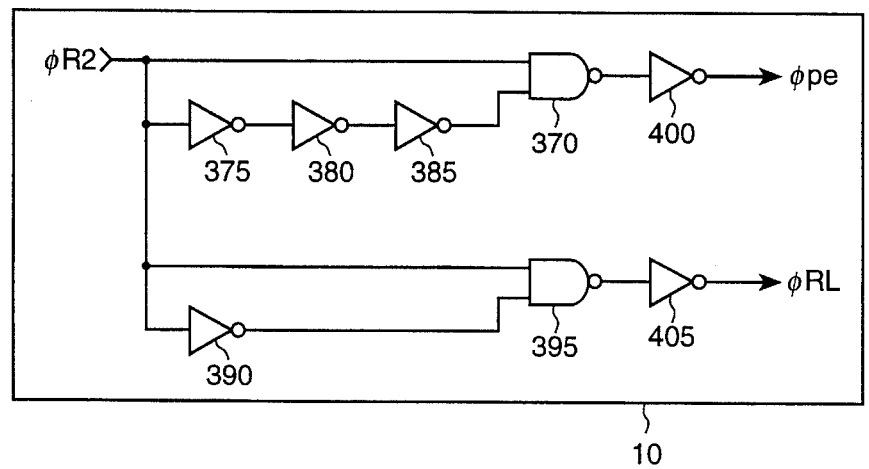
FIG. 8 is a detailed diagram showing a pulse generator of FIG. 6.

FIG. 8 is a detailed diagram showing a pulse generator 320 of FIG. 6, which includes inverters 375, 380 and 385 for delaying the control signal ΦR2 for a predetermined time after receiving the control signal ΦR2, a NAND gate 370 for performing a logic combination by receiving the control signal ΦR2 and the output signal of the inverter 385, an inverter 390 for receiving the control signal ΦR2, a NAND gate 395 for performing a logic combination by receiving the control signal ΦR2 and the output signal of the inverter 390, an inverter 400 for generating the first pulse signal Φpe by inverting the output signal of the NAND gate 370, and an inverter 405 for generating the second pulse signal ΦRL by inverting the output signal of the NAND gate 396. In operation, the pulse generator 320 receives the control signal ΦR2 generated from the control circuit 325 and outputs the first and second pulse signals Φpe and ΦRL. Here, the first pulse signal Φpe is inputted to the gate of the NMOS transistor 365 to control the operation of the sense amplifier 305. Further, the first pulse signal Φpe is inputted to the gate of the NMOS transistor 340 to control the operation of the comparison voltage generator 310. After the control signal ΦR2 of a logic "high" state generated from the control circuit 325 is inputted to the pulse generator 320, the first and second pulse signals Φpe and ΦRL are outputted.

Returning to FIG. 7, the comparison voltage generator 310 includes a PMOS transistor 330 and an NMOS transistor 335 both of whose gates are connected to the reference voltage Vref1 generated from the reference voltage generator 200, and an NMOS transistor 340 adjacent to the ground voltage terminal of the comparison voltage generator 310 whose gate is connected to the first pulse signal Φpe generated from the pulse generator 320. The voltage level of the comparison signal Vcomp2 in accordance with the power supply voltage Vcc applied to the comparison voltage generator 310 is dependent upon the size of the PMOS transistor 330 and NMOS transistor 335. If the size of the PMOS transistor 330 is larger than that of the NMOS transistor 335, the power supply voltage detecting level of the PMOS transistor 330 for sensing the change of the power supply voltage Vcc become a low. That is, the PMOS transistor 330 has an improved driving capability for the change of the power supply voltage Vcc. On the other hand, if the size of the NMOS transistor 335 is larger than that of the PMOS transistor 330, the power supply voltage detecting level of the PMOS transistor 330 becomes high. The first pulse signal Φpe is applied to the gate of an NMOS transistor 340. The comparison voltage generator 3 10 is activated only while the first pulse signal Φpe is enabled. Under such a construction, the NMOS transistor 340 can reduce power consumption by cutting off the flow of the standby-current when the comparison voltage generator 310 is in a non-activation state.

The sense amplifier 305 includes PMOS transistors 345 and 350 performing a complementary operation to each other, cross-connected NMOS transistors 355 and 360, and an NMOS transistor 365. The reference voltage Vref1 generated from the reference voltage generator 200 and the comparison voltage Vcomp2 generated from the comparison voltage generator 310 are respectively inputted to the gates of the PMOS transistors 345 and 350. In the meanwhile, the first pulse signal Φpe generated from the pulse generator 320 is inputted to the gate of an NMOS transistor 365 adjacent to the ground voltage terminal of the sense amplifier 305. If the voltage level of the power supply voltage Vcc applied to the sense amplifier 305 is over a target level, the PMOS transistor 345 is turned on and the voltage level at a node N6 goes high, as the voltage level of the voltage of the reference voltage Vref1 is lower than that of the comparison voltage Vcomp2. When the voltage level at the node N6 is high, an NMOS transistor 360 is turned on and the power supply voltage detecting signal ΦVse2 generated from the sense amplifier 305 is in a logic "low" state. On the other hand, if the voltage level of the power supply voltage Vcc applied to the sense amplifier 305 is below a target level, the PMOS transistor 350 is turned on and the power supply voltage detecting signal ΦVse2 is in a logic "high" state, as the voltage of the comparison voltage Vcomp2 is lower than that of the reference voltage Vref1. The NMOS transistor 365 operates in accordance with the first pulse signal Φpe of the pulse generator 320 of FIG. 8. The sense amplifier 305 is activated only while the first pulse signal Φpe is enabled. Under such a construction, the NMOS transistor 365 can reduce power consumption by cutting off the flow of the standby-current when the sense amplifier 305 is in a non-activation state.

Figure 9:
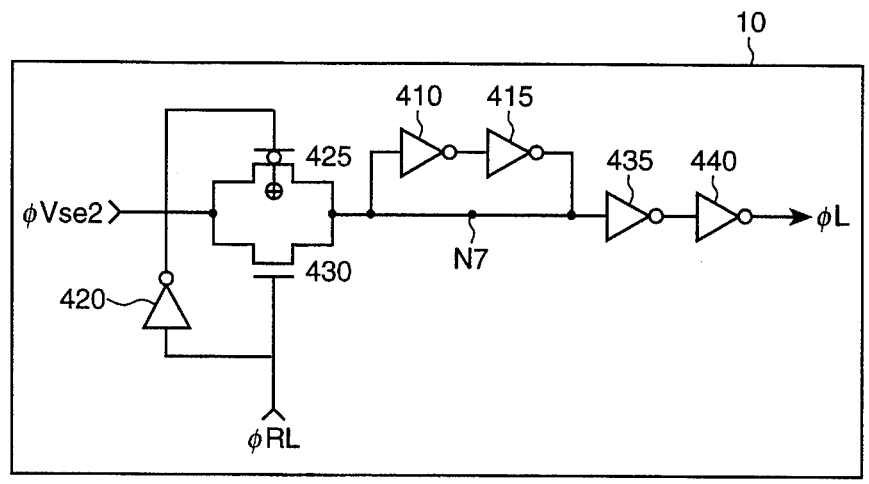
FIG. 9 is a detailed diagram showing a latch circuit of FIG. 6.

FIG. 9 is a detailed diagram showing a latch circuit 3 15 of FIG. 6. The latch circuit 315 receives the second pulse signal ΦRL generated from the pulse generator 320 and the power supply voltage detecting signal ΦVse2 outputted from the sense amplifier 305, respectively. The latch circuit 3 15 is necessary for the following reasons. Since the sense amplifier 305 operates only while the first pulse signal Φpe is changed to a logic "high" state, the sense amplifier 305 has to latch the power supply voltage detecting signal ΦVse2. On the other hand, when the power supply voltage Vcc applied to the sense amplifier 305 has a certain value of specific range, the power supply voltage detecting signal ΦVse2 generated from the sense amplifier 305 cannot maintain a complete power supply voltage level or a complete ground voltage level. Hence, in order to maintain the complete power supply voltage level or complete ground voltage level of the power supply voltage detecting signal ΦVse2, the latch circuit 315 should be provided. While the second pulse signal ΦRL generated from the pulse generator 320 is in a logic "high" state, the power supply voltage detecting signal ΦVse2 generated from the sense amplifier 305 is latched. Further, while the second pulse signal ΦRL is in a logic "low" state, the voltage level at a node N7 is set to a logic "high" state or a logic "low" state by the inserters 410 and 415.

Figure 10:
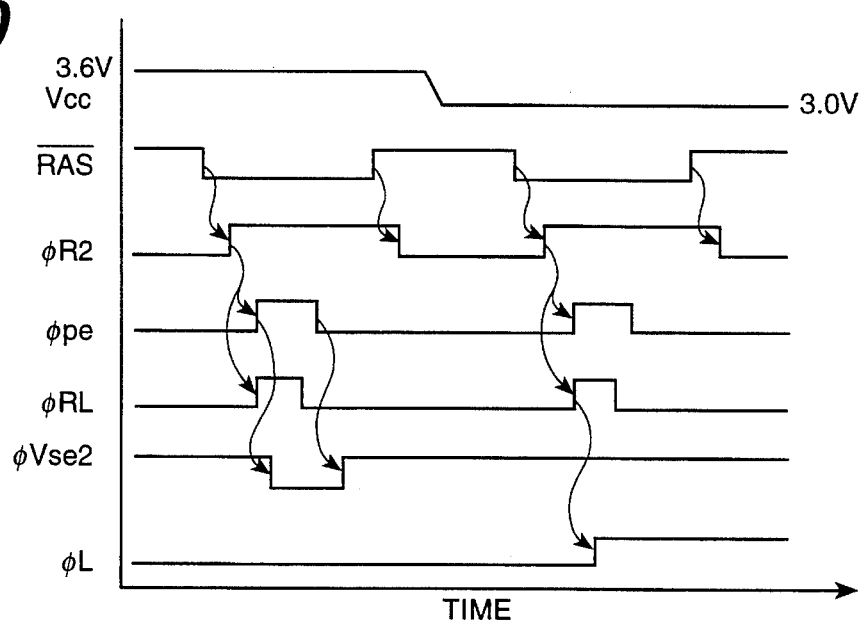
FIG. 10 is a timing diagram of FIG. 6 according to a second preferred embodiment of the present invention.

FIG. 10 is a timing diagram of FIG. 6 according to a second embodiment of the present invention. The pulse width of the second pulse signal ΦRL is set to be shorter than that of the first pulse signal Φpe, so that the output signal ΦVse2 of the sense amplifier 305 can be latched while the sense amplifier 305 is activated and the output signal ΦVse2 maintains a constant voltage level.

Therefore, the power supply-voltage-detecting circuit according to the present invention includes a circuit for generating a power-supply-voltage detecting signal by receiving a power supply voltage in a specific mode state, a control circuit for generating a control signal in order to operate the circuit for generating the power supply voltage detecting signal, thereby improving the operations of a chip.

While the invention has been particularly shown and described with reference to a preferred embodiment, it will be understood by those skilled in the art that modifications in detail may be made without departing from the spirit and scope of the invention. By way of example, a control circuit, pulse generator, and latch circuit may be implemented with various types of circuit.

As discussed above, a power supply voltage detecting circuit according to the present invention can reduce power consumption by cutting off a standby-current, since the power-supply-voltage detecting circuit is enabled during an activation of a chip. This allows the output signal of the power supply voltage detecting circuit to have an accurate voltage level of a power supply voltage or a ground voltage, so that chip operation speed can be improved and the effectiveness of the chip can be improved by removing noises.

What is claimed is:

1. A power-supply-voltage detecting circuit of a semiconductor memory device, comprising:

means for generating a power-supply-voltage detecting signal by receiving a power supply voltage; and control means for generating a control signal to operate the means for generating the power-supply-voltage detecting signal when the semiconductor memory device is in an active state.

2. A power-supply-voltage detecting circuit of a semiconductor memory device, comprising:

reference-voltage generating means for generating a reference voltage of a constant voltage level by receiving a power supply voltage;

comparison-voltage generating means for generating a comparison voltage by receiving the reference voltage;

sense amplifying means for comparing the reference voltage and the comparison voltage and amplifying a voltage difference between the reference voltage and the comparison voltage to output a power-supply-voltage detecting signal; and control means for generating a control signal to operate the comparison-voltage generating means and the sense amplifying means when a chip is in an active state.

3. The circuit as claimed in claim 2, wherein said control means generates said control signal in response to a row address strobe signal.

4. A power-supply-voltage detecting circuit of a semiconductor memory device, comprising:

reference-voltage generating means for generating a reference voltage of a constant voltage level by receiving a power supply voltage;

comparison-voltage generating means for generating a comparison voltage by receiving said reference voltage;

sense amplifying means for outputting a power-supply-voltage detecting signal by receiving said reference voltage and said comparison voltage;

latch means for latching the power-supply-voltage detecting signal by receiving said power-supply-voltage detecting signal and outputting the latched power-supply-voltage detecting signal;

control means for generating a control signal in response to an input signal; and pulse generating means for generating a first pulse signal for operating the comparison-voltage generating means and the sense amplifying means in response to the control signal and generating a second pulse signal for controlling the latch means when a chip is in a specific mode.

5. The circuit as claimed in claim 4, wherein said input signal inputted to said control means is a row address strobe signal.

6. The circuit as claimed in claim 4, wherein the first pulse signal and the second pulse signal are enabled in synchronism with the control signal and a second pulse width of the second pulse signal is shorter than a first pulse width of the first pulse signal.

* * * * *